(12) United States Patent
Towns et al.

(10) Patent No.: US 6,512,082 B2
(45) Date of Patent: Jan. 28, 2003

(54) POLYMERS, THEIR PREPARATION AND USES

(75) Inventors: Carl R. Towns, Mountfitchet (GB); Richard O'Dell, Hitchin (GB)

(73) Assignee: Cambridge Display Technology Ltd., Cambridge (GB)

(*) Notice: Subject to any disclaimer, the term of this patent is extended or adjusted under 35 U.S.C. 154(b) by 41 days.

(21) Appl. No.: 09/754,744

(22) Filed: Jan. 4, 2001

(65) Prior Publication Data

US 2001/0037012 A1 Nov. 1, 2001

Related U.S. Application Data

(60) Provisional application No. 60/185,737, filed on Feb. 29, 2000.

(30) Foreign Application Priority Data

Jan. 5, 2000 (GB) ................................ 0000095

(51) Int. Cl.⁷ ..................... C08G 73/00; C08G 72/02
(52) U.S. Cl. .................. 528/394; 528/422; 428/690; 428/917
(58) Field of Search ................. 528/394, 422; 428/690, 917

(56) References Cited

U.S. PATENT DOCUMENTS

| | | | |
|---|---|---|---|
| 5,534,613 A | 7/1996 | Tan et al. | 528/176 |
| 5,536,866 A | 7/1996 | Tan et al. | 558/420 |
| 5,633,337 A | 5/1997 | Tan et al. | 528/183 |
| 5,777,070 A | 7/1998 | Inbasekaran et al. | 528/394 |
| 5,814,244 A | 9/1998 | Kreuder et al. | 252/301.16 |

FOREIGN PATENT DOCUMENTS

WO        WO 99/54385        10/1999

OTHER PUBLICATIONS

International Search Report for PCT/GB01/00029 dated Apr. 10, 2001.
Patent Act 1977—Search Report under Section 17 for Application GB 0000095.0 Date of Search: Jun. 15, 2000.

Primary Examiner—Duc Truong
(74) Attorney, Agent, or Firm—Marshall, Gerstein & Borun

(57) ABSTRACT

A polymer which comprises triarylamine units, which polymer comprises one or more structural units comprising $Ar^h\text{-}NAr_2$, where $Ar^h$ comprises a substituted or unsubstituted heteroaryl group and each Ar is the same or different and comprises a substituted or unsubstituted aryl or heteroaryl group and excluding the copolymer where the polymer backbone contains one or more divinylenearylene units.

38 Claims, 1 Drawing Sheet

POLYMERS, THEIR PREPARATION AND USES

Figure 1:
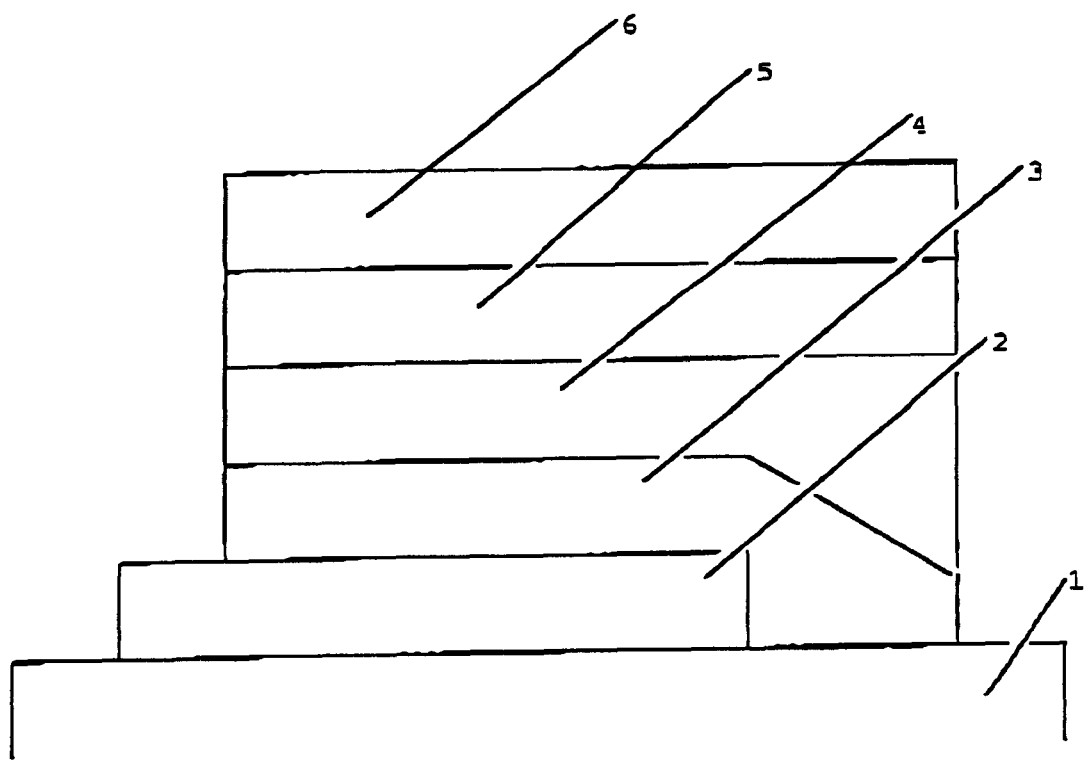

This application claims the benefit under 35 U.S.C. § 119(e) of U.S. provisional application Ser. No. 60/185,737 filed Feb. 29, 2000.

The present invention relates to a conjugated polymer and uses thereof such as in an optical device, and to a process for preparing such a polymer.

Organic electroluminescent devices which use an organic material as the light-emissive material are known in this art. Among organic materials, simple aromatic molecules such as anthracene, perilene and coronene are known to show electroluminescence. U.S. Pat. No. 4,539,507 discloses the use of small molecule organic materials as the light-emissive material, for example, 8-hydroxy quinoline (aluminium). PCT/WO90/13148 discloses an electroluminescent device comprising a semiconducting layer comprising a polymer film as the light-emissive layer which comprises at least one conjugated polymer. In this case, the polymer film comprises a poly(para-phenylene vinylene)(PPV) film.

It is known to use a semiconductive conjugated co-polymer as the light-emissive layer in an electroluminescent device. The semiconductive conjugated copolymer comprises at least two chemically different monomers which, when existing in their individual homopolymer forms, typically have different semiconductor bandgaps. The proportion of the chemically different monomer units in the copolymer can be selected to control the semiconductor bandgap of the copolymer so as to control the optical properties of the copolymer. The extent of conjugation of the copolymer affects the n—n* bandgap of the copolymer. This property may be exploited so that the semiconductor bandgap is modulated to control the wavelength of radiation emitted during luminescence. In addition, by modulating the semiconductor bandgap of the copolymer it is possible to increase the quantum efficiency of the copolymer when exited to luminesce. Furthermore, the semiconductor bandgap is a factor affecting the refractive index of the copolymer.

A method of preparation for aryl-containing conjugated polymers is the Suzuki reaction. U.S. Pat. No. 5,777,070 is directed to attempts to improve the Suzuki reaction to form conjugated polymers from aromatic monomers. The process involves contacting (i) monomers having two reactive groups selected from boronic acid, $C_1$–$C_6$ boronic acid ester $C_1$–$C_6$ borane and combinations thereof with aromatic dihalide functional monomers or (ii) monomers having one reactive boronic acid, boronic acid ester or borane group and one reactive halide functional group with each other. Various aromatic monomers are proposed including those containing triarylamines.

A triarylamine unit has the general structure $Ar^1Ar^2Ar^3N$ where each Ar is the same or different and is an aryl or heteroaryl group.

U.S. Pat. No. 5,633,337, U.S. Pat. No. 5,536,866 and U.S. Pat. No. 5,534,613 each discloses a polymer which comprises triarylamine units. In these polymers, a repeat unit can be defined which comprises a heteroaryl group. However, the heteroaryl group is not directly linked to a nitrogen group. Instead, the heteroaryl group is indirectly linked to a nitrogen group via a phenylene group. In each of these three documents this is an essential feature of the described polymer structure. This structure is essential for achieving the advantageous properties of the described polymers.

U.S. Pat. No. 5,814,244 is concerned broadly with an electroluminescence material comprising one or more polymers which comprise structural units of the formula:

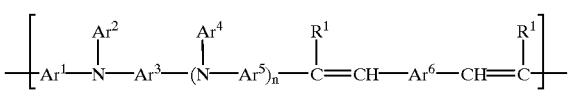

where the symbols and indices have the following meanings:
$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more bridges and/or be condensed and may be unsubstituted or substituted, where $Ar^1$, $Ar^3$, $Ar^5$ and $Ar^6$ are each divalent and $Ar^2$ and $Ar^4$ are each monovalent;
$R^1$ is H, a hydrocarbon radical having from 1 to 22 carbon atoms, which may be unsubstituted or substituted, preferably by F, and can also contain heteroatoms, preferably O, or Ar, where $Ar^7$ is, independently of $Ar^{1-6}$, as defined for $Ar^{1-6}$;
n is 0, 1 or 2.

The polymers disclosed in this document have low molecular weight and, thus, would have relatively low processability. The presence of vinyl groups in the polymer makes the polymer relatively unstable. The polymers disclosed in this document are not end-capped.

In view of the prior art, there still remains a need for providing new polymers suitable for use in optical devices, particularly electroluminescent devices.

The present invention aims to provide such a new polymer.

Accordingly, in a first aspect, the present invention provides a polymer which comprises triarylamine units. The polymer comprises one or more structural units comprising $Ar^h$-$NAr_2$ where N is directly linked to $Ar^h$ and in which each Ar is the same or different and comprises a substituted or unsubstituted aryl or heteroaryl group and N is directly linked to $Ar^h$.

FIG. 1 shows the structure of an exemplary optical device, which contains layers comprising polymers in accordance with an invention.

It has been found that incorporation of triarylamine units into polymers according to the present invention provides materials with the attractive physical and processing properties of polymers and the ability in their synthesis to select the aryl or heteroaryl groups and their substituents so as to modulate the bandgap of the polymers. This is an important feature, particularly in the design of electroluminescent devices whose efficiency can depend upon the matching of the highest occupied molecular orbital and lowest unoccupied molecular orbital levels of the polymer with the cathode and anode and device host material.

For the purposes of the present invention, the term "polymer" should be interpreted as including linear and branched polymers, oligomers, dendrimers, homopolymers, copolymers and terpolymers.

Preferably, $Ar^h$ comprises a substituted or unsubstituted nitrogen-containing heteroaryl group. Generally, the heteroaryl group should comprise an electron-deficient heteroatom.

Preferably, each Ar is a substituted or unsubstituted phenyl group. Where the phenyl group is unsubstituted, the polymer is an oligomer. Where the phenyl group is substituted, substituents may be of a nature so as simply to build up the polymer chain and/or to control the bandgap of the polymer or to confer on the polymer solubility in a particular solvent system. Typical solvents include non-polar solvents. For these purposes it is preferred that the polymer bears one or more substituents.

In a first embodiment, the polymer comprises a linear polymer in which the or each structural unit comprises $Ar^h(NAr_2)Ar^{co}$, wherein $Ar^{co}$ comprises a substituted or unsubstituted aryl or heteroaryl group, $Ar^h$ comprises a substituted or unsubstituted heteroaryl group and each Ar is the same or different and comprises a substituted or unsubstituted aryl or heteroaryl group. It is preferred that $Ar^{co}$ is different from $Ar^h$. As discussed above, a substituent on $Ar^{co}$ can modulate the semiconductor bandgap of the polymer.

The copolymer where the polymer backbone contains one or more divinylenearylene units may be excluded from the scope of the present invention. Furthermore, a homopolymer where the backbone contains one or more divinylenearylene units can be excluded from the present invention. Generally, this copolymer and this homopolymer are not excluded from the present invention.

In a first aspect of the first embodiment it is preferred that $Ar^h$ is pendent from the polymer backbone.

In a first subgroup of the first aspect of the first embodiment it is preferred that the polymer comprises a plurality of structural units, having a formula as shown in formula (13):

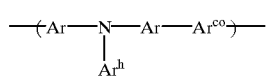

(13)

Most preferably in this first subgroup, the polymer comprises a plurality of structural units, having a formula as shown in formula (8):

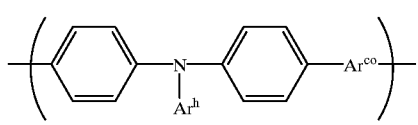

(8)

In formulae (13) and (8) above, $Ar^h$ preferably comprises a group as shown in any one of formulae (1) to (4):

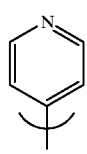

(1)

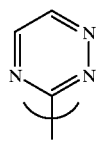

(2)

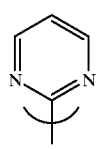

(3)

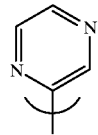

(4)

In a second subgroup of the first aspect of the first embodiment, it is preferred that the polymer comprises a plurality of structural units having a formula as shown in formula (14):

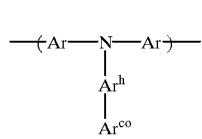

(14)

where $Ar^h$ may be further substituted. Increasing the number of substituents on $Ar^h$ is one way of increasing the solubility of the polymer.

Most preferably in this second subgroup the polymer comprises a plurality of structural units, having a formula as shown in formula (15):

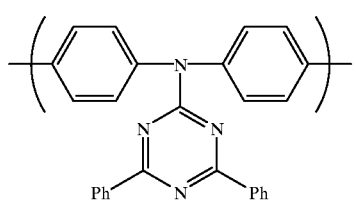

(15)

Other substituents can be used on the triazine ring. These substituents modulate the bandgap of the polymer and alter the charge transport properties of the polymer.

Conveniently, the triazine ring is stable and is easily substituted. However, groups such as any isomer of diazine or pyridene could be used in place of the triazine ring.

A polymer comprising a repeat unit having a formula as shown in one of formulas (8), (13), (14) or (15) may comprise a copolymer or co-oligomer. Alternatively, the polymer may comprise a homopolymer or homo-oligomer that is made from a single type of monomer. In this regard a monomer is distinguished from a repeat unit in so far as a homopolymer, for example $(AB)_n$, may be defined as having one or more different repeat units (i.e. a single repeat unit AB, or a repeat unit A and a repeat unit B).

A typical process for preparation of a polymer according to the first subgroup of the first aspect of the first embodiment is as follows.

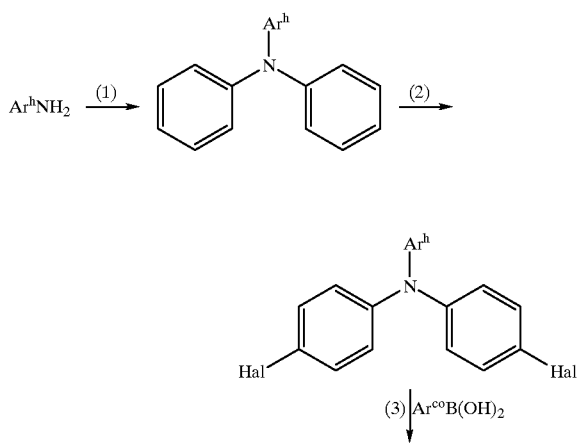

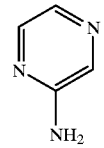
(4a)

In a second aspect of the first embodiment, $Ar^h$ forms a part of the polymer backbone. In this second aspect, it is preferred that $Ar^h$ comprises an amino substituted heteroaryl group, more preferably, an amino substituted heteroaryl group having formula (5):

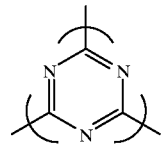
(5)

In the above reaction scheme, each Hal is preferably Br. The conditions in step 3 are any conditions under which the reactants polymerise such as under Suzuki polymerisation conditions which may typically involve the use of a palladium catalyst. Step 1 is typically a palladium or copper coupling reaction where the starting material, $Ar^hNH_2$, is reacted with iodobenzene or bromobenzene Step 2 is a halogenation reaction.

Where $Ar^h$ comprises a group as shown in any one of formulae (1) to (4), $Ar^hNH_2$ as referred to in the above reaction scheme may be:

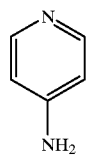
(1a)

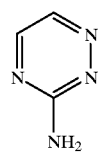
(2a)

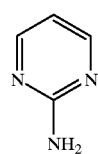
(3a)

In the second aspect of the first embodiment, it is preferred that $Ar^{co}$ is a substituted or unsubstituted phenyl group. $Ar^{co}$ is chosen having regard to steric hinderance and possible twisting of the polymer chain with a view to controlling the extent of conjugation of the polymer.

In the second aspect of the first embodiment, it is further preferred that $Ar^{co}$ is pendent from the polymer backbone, in this regard, it is still further preferred that the or each structural unit comprises a group having formula (11):

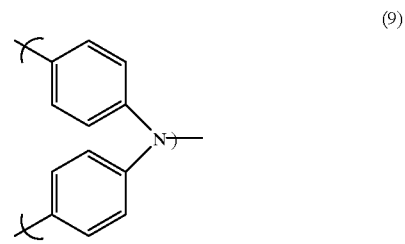
(11)

where $Ar^h$, $Ar^{co}$ are as defined above and $(Ar_2N)$ is the same or different from $(NAr_2)$.

Preferably, $(NAr_2)$ and $(Ar_2N)$ are the same. More preferably, $(NAr_2)$ and $(Ar_2N)$ each comprise a group having general formula (9) that is substituted or unsubstituted:

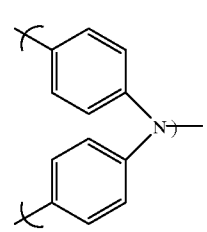
(9)

Advantageously, in the first embodiment of this invention, the or each structural unit is a repeat unit in the present polymer. Preferred structural units that are each a repeat unit according to the second aspect of the first embodiment are shown by Formulae (12a) and (12b) and (16a) and (16b):

(12a)

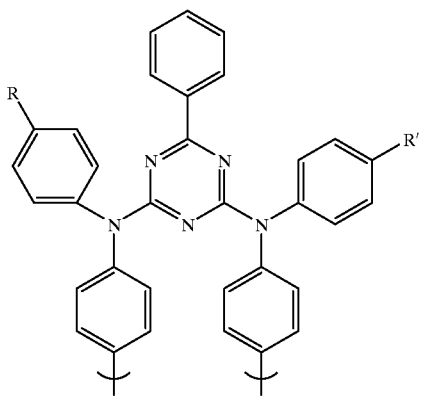

(12b)

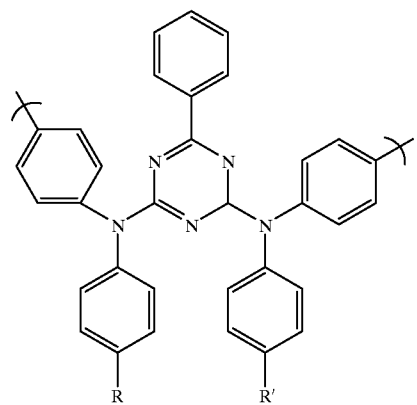

(16a)

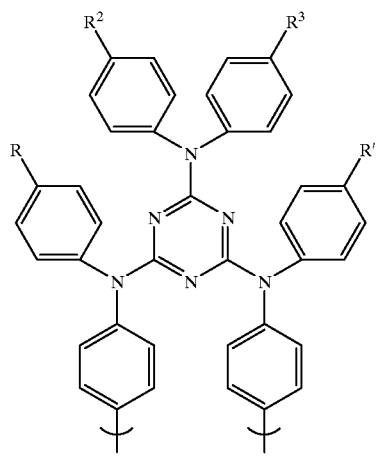

or

-continued (16b)

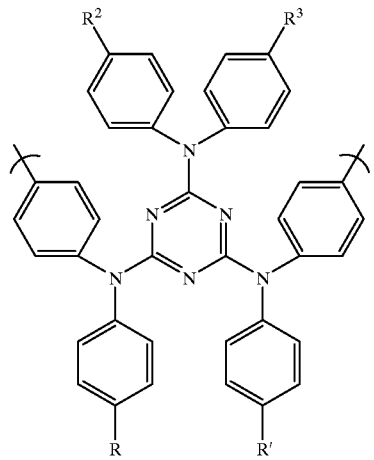

where R, $R^1$, $R^2$ and $R^3$ are the same or different and each R is a substituent group, preferably hydrocarbyl, optionally containing one or more heteroatoms, more preferably aryl, alkyl, heteroaryl, heteroalkyl, arylalkyl, aromatic or heteroaromatic.

Preferably, R and R' are the same.

A particular structural unit that is a repeat unit of interest having formula (12) is shown by Formula (13):

(13)

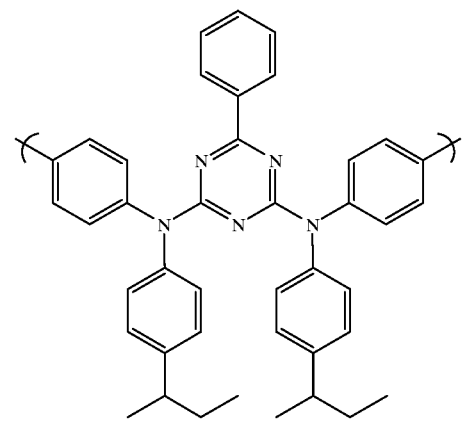

The present inventors envisage that a homopolymer comprising a repeat unit having general formula (12), (13) or (16) would be useful as an electron transport material in an optical device, particularly an electroluminescent device.

Also, reference is made to International patent publication No. WO/0055927 the contents of which are incorporated herein by reference. Repeat units according to the present invention such as those having general formula (12), (13) or (16), particularly general formula (12), are envisaged to be useful as charge (hole or electron) transporters and/or as emitters in polymers according to WO/0055927.

The first steps in a typical process for preparing a polymer comprising a structural unit or repeat unit having formula (12) or (13) are shown below:

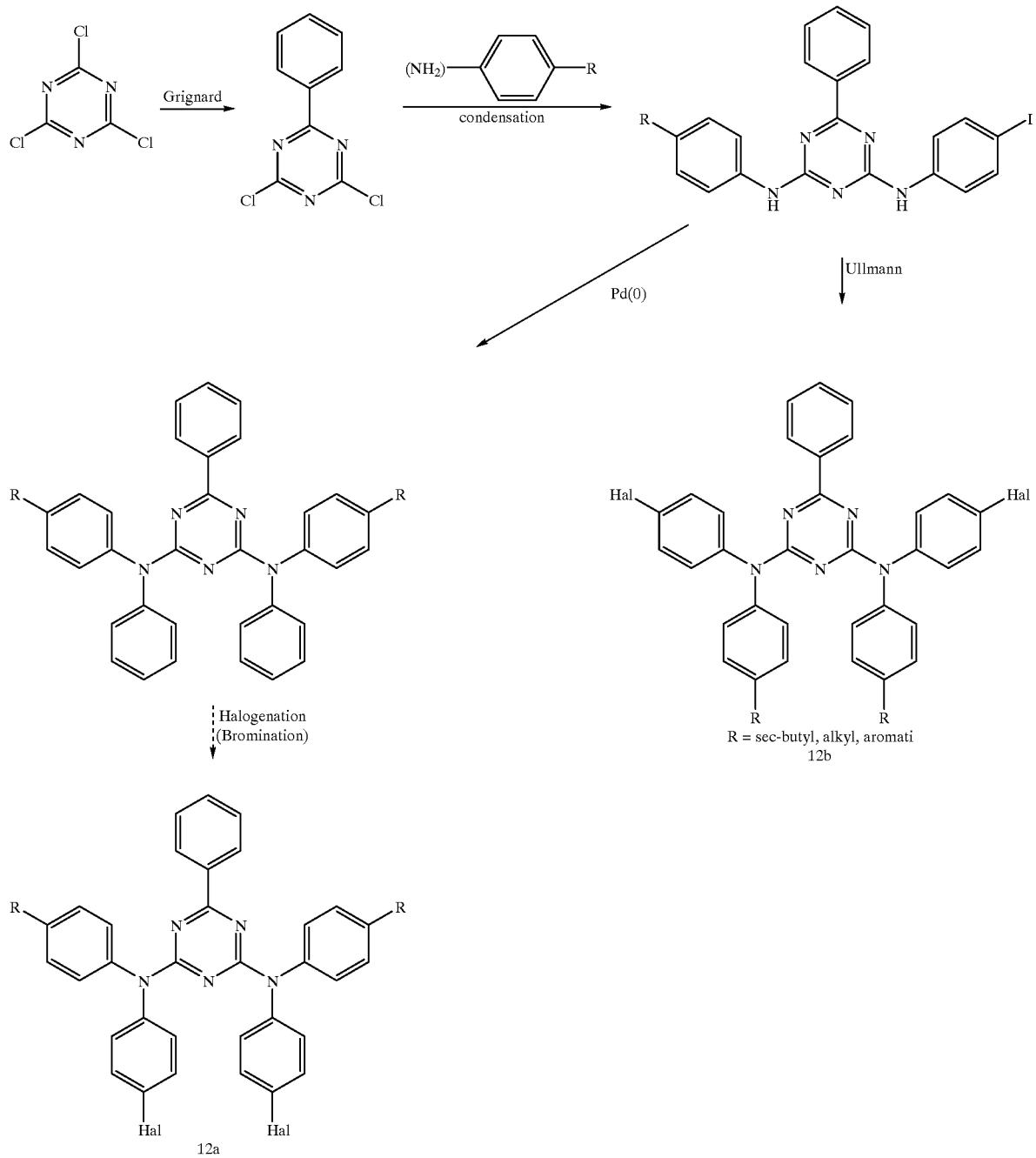

Product 12a or 12b then can be used in any suitable polymerisation reaction to obtain a polymer according to the second aspect of the first embodiment.

In the above reaction scheme, each Hal is preferably Br.

A preferred polymer in accordance with the second aspect of the first embodiment is a copolymer. Such polymers are envisaged as being useful for transporting electrons when used in an optical device, particularly an electroluminescent device. At the same time as being capable of transporting electrons, such polymers also may be capable of transporting protons and/or combining protons and electrons so as to generate light.

It is preferred that a polymer according to the first or second aspect of the fist embodiment is at least 100, preferably at least 105, monomers in length. A typical upper limit for the polymer length is about 300 monomers, although the length could be up to 1000 monomers.

In a second preferred embodiment, the polymer comprises a dendrimer comprising an initiator core or core unit and branch units. Preferably, the one or more structural units comprises a core unit. Most preferably, the polymer has a single structural unit.

According to the second embodiment, the dendrimer more preferably comprises a branch unit, specifically one type of branch unit, the most preferred branch unit being as shown in formula (9) which is substituted or unsubstituted.

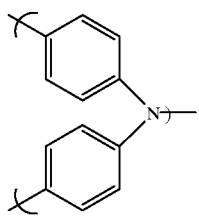

(9)

Preferably the dendrimers according to the second embodiment of the present invention are from $1^{st}$ to $10^{th}$ generation dendrimers.

In a first aspect of the second embodiment, one or more structural units comprises $Ar^h(NAr_2)_3$, where each N is directly linked to $Ar^h$ and each $(NAr_2)$ is the same or different. Preferably, each $(NAr_2)$ is the same and is a substituted or unsubstituted phenyl group. As discussed above, each $(NAr_2)$ is chosen so as to control the bandgap of the polymer.

It is preferred that, in the first aspect of the second embodiment, $Ar^h$ comprises a group as shown in formula (5):

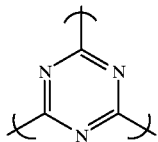

(5)

In the most preferred first aspect of the second embodiment, the polymer comprises a single structural unit comprising a group as shown in formula (6):

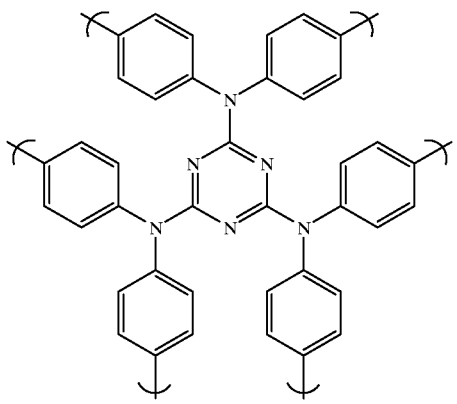

(6)

where the structural unit comprises the core unit.

In a second aspect of the second embodiment, the structural unit comprises $Ar^h(NAr_2)_2Ar''$, where $Ar''$ is a substituted or unsubstituted aryl or heteroaryl group and each $(NAr_2)$ is the same or different. Preferably, as in the first aspect of the second embodiment, each $(NAr_2)$ is the same and is a substituted or unsubstituted phenyl group.

Preferably, $Ar''$ is a substituted or unsubstituted phenyl group. $Ar''$ should be chosen having regard to steric hinderance and possible twisting of the polymer chain with a view to controlling the extent of conjugation of the polymer.

In a most preferred embodiment of the second aspect of the second embodiment, the polymer comprises a single structural unit comprising a group having the formula as shown in formula (7):

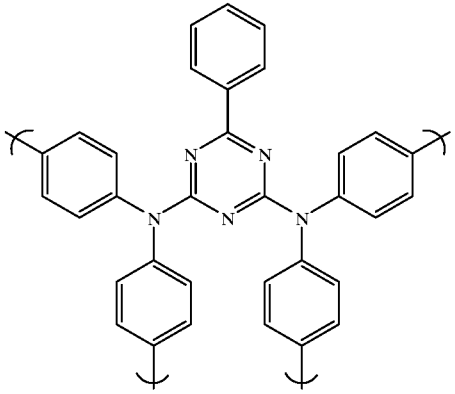

(7)

where the single structural unit comprises the core unit.

A typical process for preparation of a polymer according to the first aspect of the second embodiment involves melamine as a starting material. This may be subjected to a palladium coupling reaction with iodobenzene or bromobenzene to produce a structure as shown in formula (10):

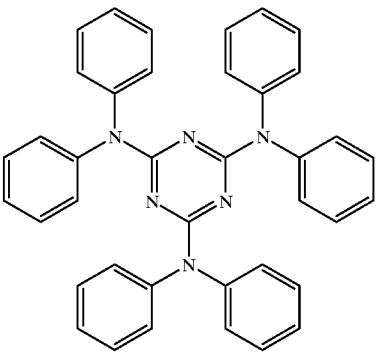

(10)

Further generations of the dendrimer may be built by subjecting the compound having formula 10 to one or more cycles of halogenation, preferably bromination, followed by a reaction with $(Ph)_2NB(OH)_2$, under appropriate conditions. This may conveniently be carried out using a Suzuki reaction. A corresponding process may be used to prepare a polymer according to the second aspect of the second invention where 2,4,diamino-6-phenyl-1,3,5-triazine (a melamine derivative) is used in place of the melamine starting material.

In the second embodiment, the core unit may comprise a structure as shown in formula (6) or (7). In the polymer, linear repeat units such as those shown in formula (12) or (15) may be attached to the core unit. Such polymers may be defined as "linear" but dendrimeric. These polymers are envisaged to be useful as charge (electron or hole) transport materials and/or as emissive materials.

Such a polymer preferably is at least 100, preferably at least 150, monomers in length. A typical upper limit for the polymer length is about 300 monomers, although the length could be up to 1000 monomers.

In a further aspect, there is provided use of a polymer according to the first or second embodiment of the present invention in an optical device such as a luminescent device, preferably an electroluminescent device. Other devices include photoluminescent devices, photovoltaic devices and waveguides. Uses include the use of the polymer as an emissive material, a hole transporter or an electron transporter, typically in an electroluminescent device. The polymers may also be used in a dye composition, in a fiber or in a sensor.

In the present invention, there is further provided an optical device comprising a substrate and a composition supported by the substrate, which composition comprises a polymer according to the present invention. The substrate may itself be an electrode or any other type of substrate suitable for supporting the composition. The composition may include various layers such as an emissive layer optionally in contact with one or more hole and/or electron-transporting layer. Where the optical device comprises an electroluminescent device, the composition includes an electroluminescent emissive layer which may be the polymer or another emissive polymer.

A typical electroluminescent device will have an anode layer, a cathode layer and a light-emissive layer situated between the anode and the cathode. Optionally, a charge transport layer may be situated between the anode and/or the cathode and the light-emissive layer.

A blend of materials including a polymer according to the present invention may be used as the light-emissive layer in an electroluminescent device. Preferably, the polymer according to the present invention is blended with one or more hole and/or electron-transporting materials, even more preferably hole and/or electron-transporting polymers.

Alternatively, the polymer according to the present invention may be blended with an electroluminescent material, preferably any electroluminescent polymer.

Several different polymerisation methods are known which may be used to manufacture polymers in accordance with the present invention.

One particularly suitable method is disclosed in International patent publication No. WO 00/53656, the contents of which are incorporated herein by reference. This describes the process for preparing a conjugated polymer, which comprises polymerising in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a catalyst suitable for catalysing the polymerisation of the aromatic monomers, and an organic base in an amount sufficient to convert the reactive boron derivative functional groups into —$BX_3$ anionic groups, wherein X is independently selected from the group consisting of F and OH.

Polymers according to the present invention which have been produced by this method are particularly advantageous. This is because reaction times are short and residual catalyst, e.g. palladium, levels are low.

This polymerisation method allows good control of the molecular weighs of the polymer. In part this is because this polymerisation method gives rise to few side reactions which means that polymers having a high molecular weight, for example, more than 100 or 150 repeat units and up to 300 repeat units or 1000 repeat units, may be obtained.

It should be noted that polymers according to the present invention may be end-capped to remove the halogen end-groups. This end-capping, for example by the addition of halobenzene or phenyl boronic acid. This is exemplified in Example 3(ii).

Another polymerisation method is disclosed in U.S. Pat. No. 5,777,070, The process involves contacting monomers having two reactive groups selected from boronic acid, C1–C6 boronic acid ester, C1–C6 borane and combinations thereof with aromatic dihalide functional monomers or monomers having one reactive boronic acid, boronic acid ester or borane group and one reactive halide functional group with each other.

A further polymerisation method is known from "Macromolecules", 31, 1099–1103 (1998). The polymerisation reaction involves nickel-mediated coupling of dibromide monomers. This method commonly is known as "Yamamoto Polymerisation".

Example 1

Triazine 1 Synthesis:
General Reaction Scheme

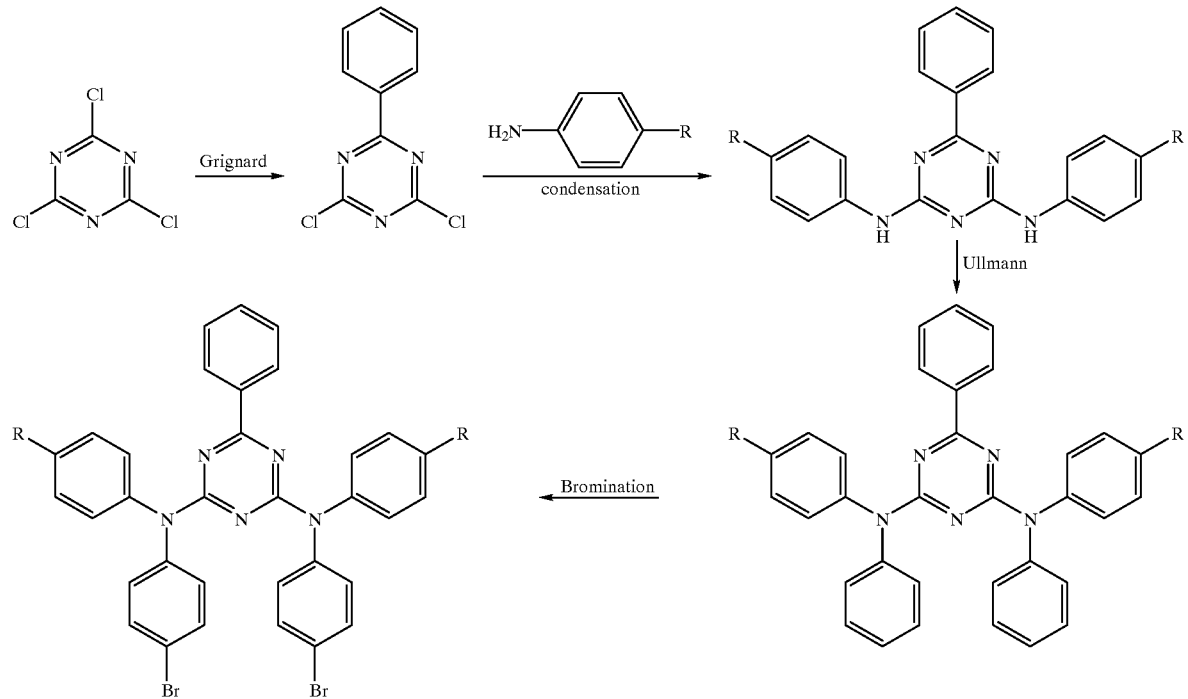

(i) Preparation of 2-phenyl-4,6-dichloro triazine
Ref: Helv. Chim. Acta, 1950, 179, 1365.

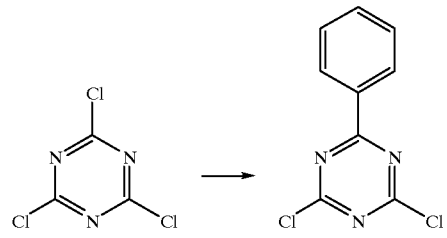

To a cooled −78° C. solution of cyanuric chloride (10 g, 54.9 mmol) in THF (150 mL) was added dropwise phenyl Mg—Sr (325 mL, 1 M in THF). The reaction mixture was allowed to warm, with stirring, to room temperature. The reaction mixture was evaporated to dryness and then treated with $Et_2O$—$H_2O$ wash. Extraction with ether afforded 1.02 g (93%) pure. The residue remaining after the extraction was dissolved in $CH_2Cl_2$. This was purified via column chromatography in hexane (dry loaded) to give 10 g of desired product as white crystals (99.2%). The overall yield was 90%; 99.2% HPLC purity; $^1H$ NMR ($CDCl_3$) 8.52 (2H, dd, J 1.4, 8.5), 7.66 (1H tt, J 1.4, 2.7, 8.6), 7.57–7.50 (2H, m).

(ii) Preparation of Mono-Sub Phenyl Triazine:
Ref: J. Polym. Sci. Polym Chem. Ed., 1984, 22,503

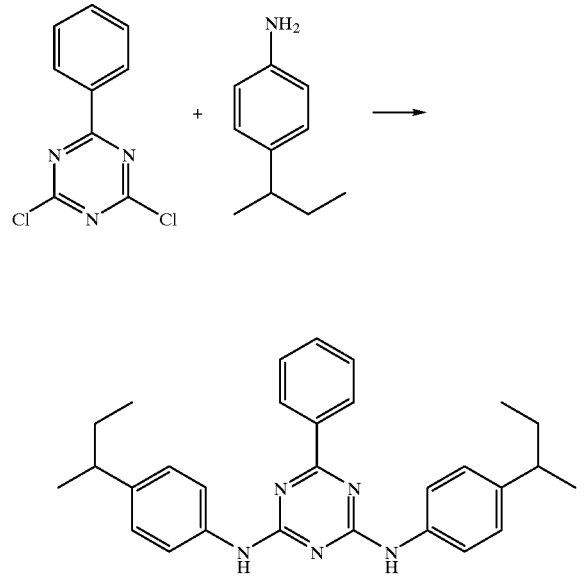

A mixture of 4-sec butyl aniline (23.6 mL) and $Na_2CO_3$ (4.69 g, 44.2 mmol) in dioxane (100 mL) was heated to 115° C. Once this temperature was achieved 2-phenyl-4,6-dichloro triazine (10 g, 44.2 mmol) in dioxane (100 mL) was added dropwise over a 3 h period. Completion of the reaction was confirmed by tlc. The reaction was quenched by pouring onto ice, the product precipitated as a beige solid. Recrystallisation from EtOAc/hexane gave 15.7 g (79%; 100% HPLC) of the desired material as a white powder. $^1H$ nmr ($CDCl_3$) 8.43 (2H,d, J 6.3), 7.56-7.44 (7H,m), 7.32 (2H, brs, NH), 7.32 (4H,d, J 8.3), 2.66-2.53 (2H,m), 1.60 (4H, m), 1.26 (6H,d, J 6.8), 8.0.87 (6H,t, J 7.4); GC-MS 452, 451, 422, 197, 145, 128, 104.

(iii) Preparation of Precursor to Triazine Series I:

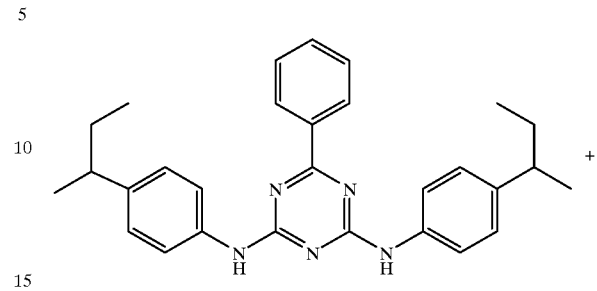

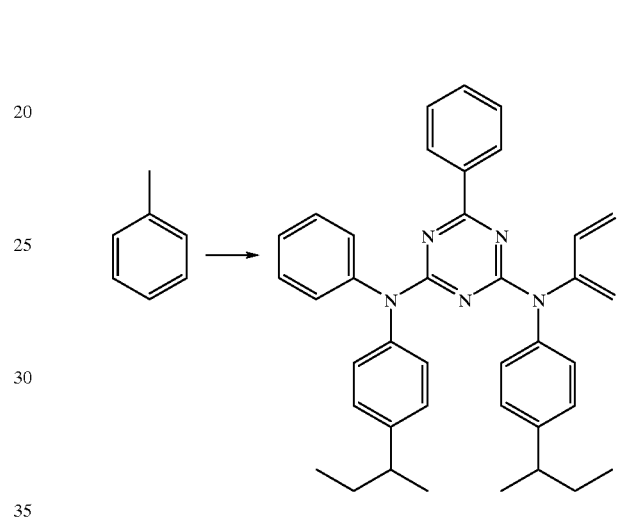

To a solution of mono sub phenyl triazine (10.56 g, 23.4 mmol) in DMF (250 mL) was added copper (5.94 g, 93.48 mmol), potassium carbonate (25.84 g, 187.0 mmol), 18-crown-6 (1.24 g, 4.69 mmol) and iodo benzene (6.55 mL, 14.6 mmol). After 72 h of heating the reaction mixture the suspension was allowed to cool to room temp. and then filtered through celite. Purification of the product was achieved using column chromatography and recrystallisation, giving 12.93 g (92%) of desired product as a white solid. $^1H$ nmr ($CDCl_3$) 8.02 (2H,d, J 5.56), 7.38 (1H, t, J 5.2); 7.28-7.06 (20w, m); $^{13}C$ nmr ($CDCl_3$) 12.477, 21.961, 31.484, 41.456, 125.557, 127.310, 127.600, 127.928, 128.263, 128.690, 128.789, 131.572, 137.176, 141.377, 143.954, 145.059, 166.513, 170.783.

Preparation of Triazine I:

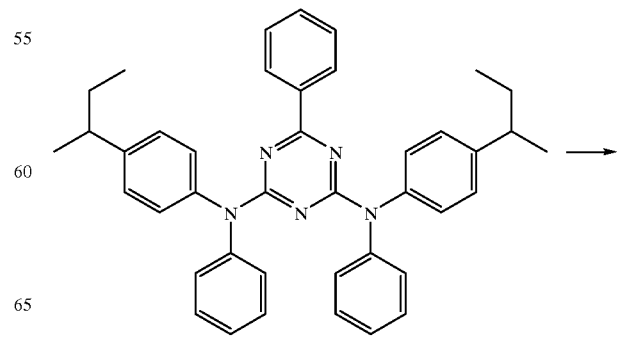

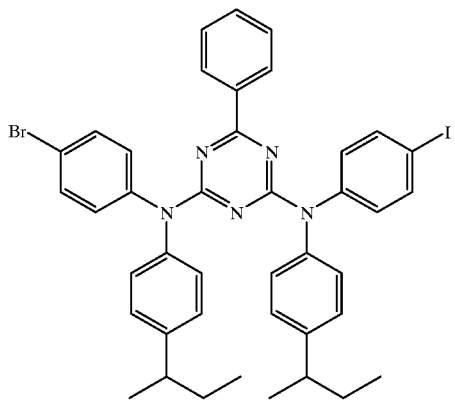

To a solution of precursor triazine 1 (12.94 g, 21.4 mmol) in DMF (50 mL) was added a solution of N-bromo succinimide (7.63, 42.8 mmol) and the reaction mixture stirred at r.t. After 72 h, the product precipitated out as a white solid. This was filtered off and washed with water. The product was then purified with Pet-Ether (100–120° C.) to give 3.66 g (22%) yield of desired product. N.b. 50% of product was lost during purification. An alternative solvent may proove more successful; $^1$H nmr (CDCl$_3$) 8.02 (2H,d, J 7.2), 7.42–7.10 (19H, m), 2.64-2.58 (2H, m), 1.64-1.57 (4H, m), 1.27 (6H, d, J 6.8), 0.88 (6H, t, J7.2); $^{13}$C nmr (CDCl$_3$) 12.44, 21.91, 31.48, 41.45, 118.84, 127.524, 127.68, 128.37, 128.77, 129.33, 131.73, 131.85, 136.81, 140.79, 142.90, 145.75, 166.26, 171.03;

Example 2

Synthesis of Triazine 2: General reaction Scheme

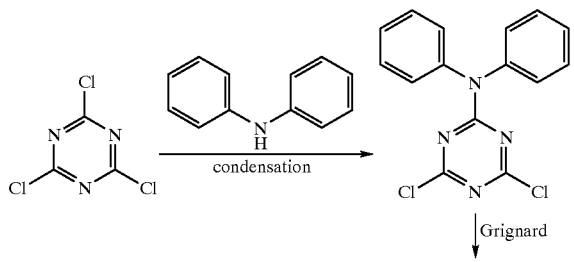

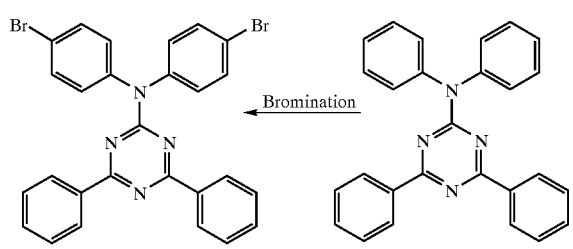

(i) Preparation of 2-diphenylamine-4,6-dichloro triazine

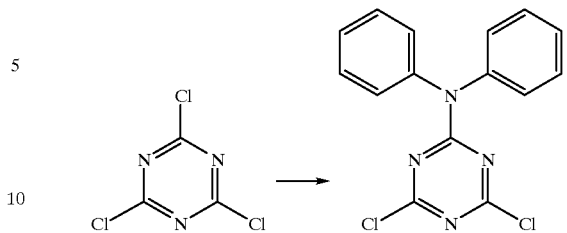

To a heated solution of diphenylamine (9.18 g, 54.2 mmol), sodium carbonate (5.75 g, 54.2 mmol) in 1,4-dioxane (100 mL) was added a solution of cyanuric chloride (10 g, 54.2 mmol) in 1,4-dioxane (25 mL). Heating was maintained for 2 h after which the reaction mixture was poured onto ice water. The product precipitated out as a cream powder. Recrystalliastion from IPA afforded 13.76 g (80% yield) of $^2$-diphenylamine-4,6-dichloro triazine; $^1$H NMR (CDCl$_3$) 7.20–7.42 (10H, m); $^{13}$C NMR 122.23, 122.67, 124.50, 136.64, 160.89, 165.64.

(ii) Preparation of 2 diphenylamine-4,6-diphenyl-triazine

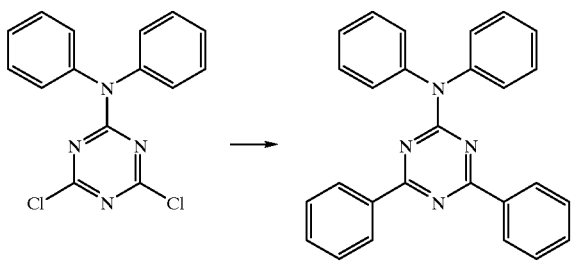

To a cooled (–78° C.) suspension of 2 diphenylamine-4, 6-diphenyl-triazine (13.76 g, 43.4 mmol) THF (150 mL) was added dropwise phenyl magnesium bromide (28.92 mL, 86.8 mmol, 3M solution in diethyl ether). The temperature was maintained below –60° C. throughout the addition of the Grignard reagent. Once addition was complete the reaction mixture was allowed to warm to room temperature. The THF was removed under vacuum and then the residue re-dissolved in toluene and washed with 10% citric acid. The organic phase was washed with water, followed by concentration under vacuum. The product precipitated out as a white powder giving 10.36 g (60% yield).

(iii) Preparation of dibromo-2 diphenylamine-4,6-diphenyl-triazine

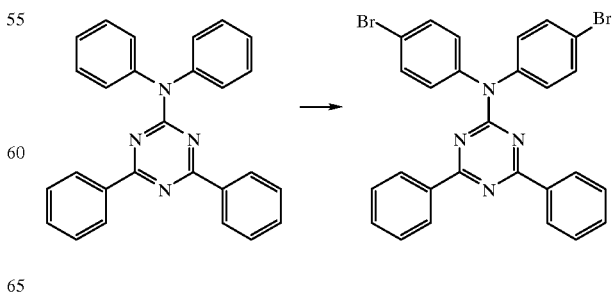

To a solution of 2-diphenylamine-4,6-diphenyl-triazine (500 mg, 1.25 mmol) in CH$_2$Cl$_2$ (10 mL) was added N-bromo succinimide (444 mg, 2.5 mmol). The solution was stirred at room temperature for 4 days. GC-MS indicated the reaction had gone to completion. The reaction mixture was filtered and the filtrate evaporated to dryness. The desired product was recrystallised from dioxane/hexane.

Scale Up, Alternative Solvent 2-diphenylamine-4,6-diphenyl-triazine (10.3 g, 25.87 mmol) in DMF (50 ml) and THF (10 mL) was heated to 70° C. until a clear solution formed. The reaction mixture was allowed to cool the 45° C. before N-bromo succinimide (9.21 g, 51.74 mmol) was added. The suspension was stirred at room temperature for 2 days. GC-MS revealed 40% mono brominated material and 60% desired product.

Example 3

(i) Preparation of TFPy-dibromide

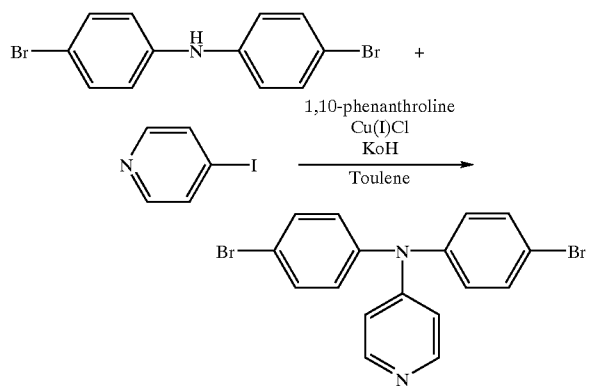

Under nitrogen, a flask was charged with toluene (55 mL), dibromodiphenylamine (7.26 g, 22.2 mmol), 4-iodopyridine (5.00 g, 24.4 mmol), 1.10-phenanthroline (0.145 g, 0.805 mmol), copper (i) chloride (0.08 g, 0.0808 mmol), potassium hydroxide (flakes, 9.76 g, 174 mmol) and then heated at 117° C. overnight.

After 18 hours, tlc indicated that some dibromodiphenylamine remained. A further 0.91 g (4.44 mmol) of the 4-iodopyridine as well as an extra aliquot of catalyst and ligand was added and heating resumed at 117° C. overnight.

The reaction mixture was allowed to cool to room temperature then treated with toluene (100 mL) and water (100 mL). The solid residue remaining was filtered off.

The aqueous phase was removed and washed with toluene (2×30 mL). The combined toluene layers were washed with water (3×100 mL) until neutral then they were treated with 2N hydrochloric acid (2×50 mL) and washed with water. The product started to precipitate as the acid salt. This suspension was washed with ether (3×50 mL) then basified with 2N sodium hydroxide. The yellow solid precipitate was extracted into dichloromethane (3×20 mL). The combined dichloromethane layers were washed with water (100 mL), saturated sodium chloride (100 mL), dried over MgSO$_4$, filtered and evaporated to give 9 g of a dark oil. This oil was triturated with 20 mL of methanol to give a white solid (5.28 g). This material was treated with hot methanol and the solid was filtered off. The mother liquors were concentrated to give 3.89 g of product. Recrystallisation from isopropanol afforded 2.8 g of a white solid (31% yield).

$^1$H NMR (CDCl$_3$) 8.28 (2H, d, J 6.8), 7.47 (4H, d AB, J 8.8), 7.03 (4H, d AB, J 8.8), 6.75 (2H, d, J 6); $^{13}$C NMR (CDCl$_3$) 153.2, 150.7, 144.3, 133.2, 128.0, 118.9, 113.7.

(ii) Preparation of TFPy-F8 Co-polymer

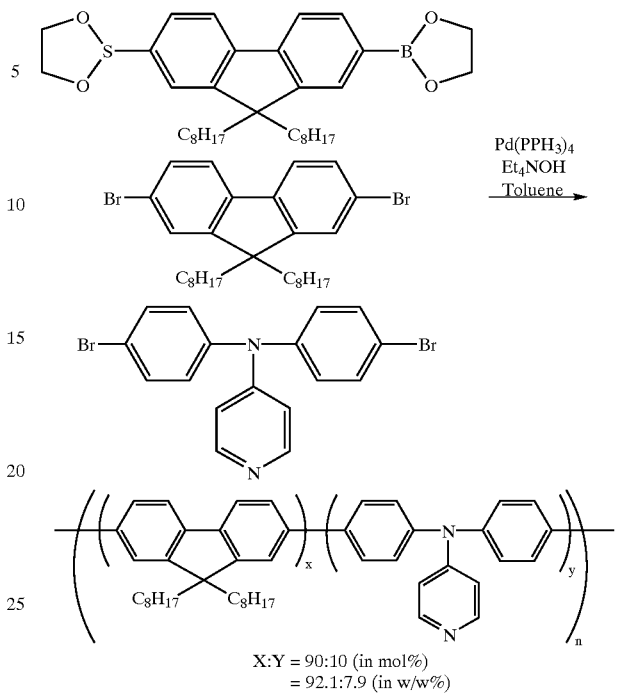

X:Y = 90:10 (in mol%)
= 92.1:7.9 (in w/w%)

A three-neck 250 mL RBF equipped with a glass stirring rod attached to a mechanical stirrer and a condenser connected to a nitrogen line was charged with F8-diboronic ester (4.7734 g, 9 mmol), F8-dibromide (3.9490 g, 7.2 mmol), TFPy-dibromide (0.7276 g, 1.8 mmol) and toluene (45 mL) The solution was stirred under nitrogen for 10 min at room temperature. The catalyst tetrakis (triphenylphosphine)palladium (31.4 mg) was added. After ten minutes, tetraethylammonium hydroxide (20% wt in water, 30 mL) was added. The reaction mixture was heated to 115° C. and maintained at reflux overnight. Bromobenzene was added (1.5 mL) and the mixture was allowed to stir at reflux for 45 min. Phenyl boronic acid (1.5 g) was added and the solution refluxed for a further 1 h 30 then allowed to cool to room temperature.

The polymer was precipitated into 3 L of methanol and then redissolved in toluene (300 mL) by heating at 115° C. for few hours. A solution of diethyldithiocarbamic acid sodium salt trihydrate (10 g in 110 mL of water) was added and the mixture was stirred under nitrogen at 65° C. overnight.

The mixture was allowed to cool to room temperature and the aqueous phase was separated from the organic phase. The salt wash was then repeated with diethyldithiocarbamic acid sodium salt trihydrate (10 g in 110 mL of water) and the mixture was again stirred for 4 hours under nitrogen at 65° C.

After cooling to room temperature, the aqueous phase was separated from the organic phase. The organic phase was washed with water (250 mL).

The aqueous phase was separated from the organic phase. ⅕ of the organic phase was filtered through 60 g of celite and washed with toluene. The solvent was concentrated to 70 mL then added dropwise into 600 mL of methanol. The precipitated polymer was filtered then dried to afford 0.92 g, Mp 260,000. The rest of the organic phase (⅘) was also filtered through 60 g of celite and washed with toluene. The solvent was concentrated to 250 mL then added dropwise into 2.5 L of methanol. The dried polymer gave 5.39 g, Mp 256,000.

Based on the above Examples and the information provided on general polymerisation methods the skilled person will be able to prepare further polymers according to this invention, for example:
1) Polymerisation of F8-diboronic ester (50%), F8-dibromide (30%) and Triazine 1 (20% triazine 1 prepared in Example 1.
2) Polymerisation of F8-diboronic ester (50%), F8-dibromide (40%) and triazine 1 (10%). This procedure is the same as Example (3ii) but with Triazine 1 instead of TFPy.
3) Polymerisation of F8-diboronic ester (50%) and Triazine 1 (50%)

Example 4

An optical Device

A suitable device structure is shown in FIG. 1. The anode 2 is a layer of transparent indium-tin oxide ("ITO") supported on a glass or plastic substrate 1. The anode 2 layer has a thickness between 1000–2000 Å, usually about 1500 Å. The cathode 5 is a Ca layer having an approximate thickness of 1500 Å. Between the electrodes is a light emissive layer 4 having a thickness up to about 1000 Å. The emissive layer 4 comprises between 0.5 to 30% by weight of the present polymer with the remainder of the emissive layer consisting of hole and/or electron transport material and/or emissive material. Advantageously, the device includes a hole transport material layer 3 of PEDOT having a thickness of about 1000 Å. Layer 6 is an encapsulant layer of a suitable thickness.

What is claimed is:

1. A polymer which comprises triarylamine units, which polymer comprises one or more structural units comprising:

Ar$^h$-NAr$_2$, where Ar$^h$ comprises a substituted or unsubstituted heteroaryl group and each Ar is the same or different and comprises a substituted or unsubstituted aryl or heteroaryl group and excluding the copolymer where the polymer backbone contains one or more divinylenearylene units.

2. A polymer according to claim 1, wherein Ar$^h$ comprises a substituted or unsubstituted nitrogen-containing heteroaryl group.

3. A polymer according to claim 1, wherein each Ar is a substituted or unsubstituted phenyl group.

4. A polymer according to claim 1, which comprises a liner polymer in which the or each structural unit comprises Ar$^h$(NAr$_2$)AR$^{CO}$, wherein Ar$^{CO}$ comprises a substituted or unsubstituted aryl or heteroaryl group.

5. A polymer according to claim 1, wherein Ar$^h$ is part of the polymer backbone.

6. A polymer according to claim 5, which comprises a plurality of structural units having a formula as shown in formula (11):

(11)

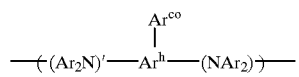

where (NAr$_2$) and (Ar$_2$N) are the same or different from one another.

7. A polymer according to claim 5, wherein Ar$^h$ comprises a triazine group.

8. A polymer according to claim 7 which comprises a plurality of structural units having a formula as shown in formula (12a), (12b), (16a) or (16b):

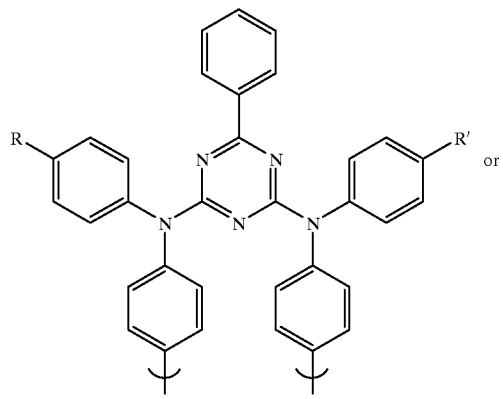

(12a)

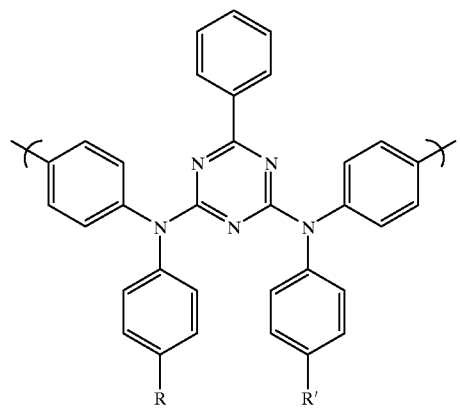

(12b)

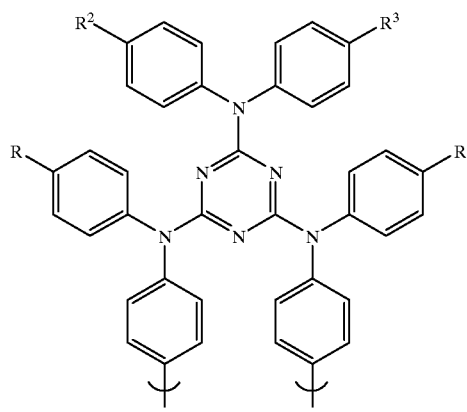

(16a)

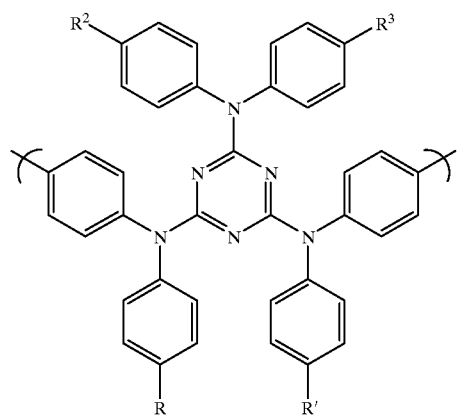

(16b)

where R, R¹, R² and R³ are the same or different and each is a hydrogen, aryl, alkyl, heteroaryl, heteroalkyl, arylalkyl, aromatic or heteroaromatic group.

9. A polymer according to claim 1, wherein Ar$^h$ is pendent from the polymer backbone.

10. A polymer according to claim 9, which comprises a plurality of structural units having a formula as shown in formula (13):

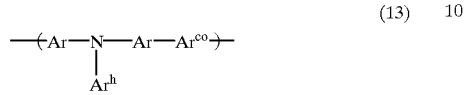

(13)

11. A polymer according to claim 10, which comprises a plurality of structural units having a formula as shown in formula (8):

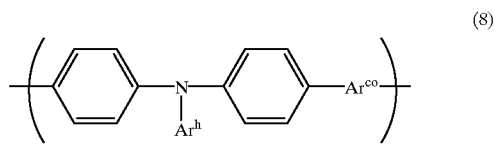

(8)

12. A polymer according to claim 10, wherein Ar$^h$ comprises a group as shown in any one of formulas (1) to (4):

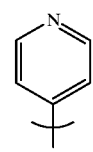

(1)

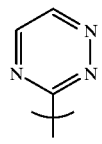

(2)

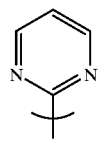

(3)

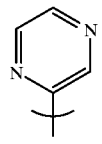

(4)

13. A polymer according to claim 9, which comprises a plurality of structural units having a formula as shown in formula (14):

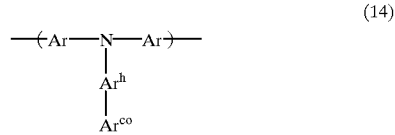

(14)

14. A polymer according to claim 13, which comprises a plurality of structural units having a formula as shown in formula (15):

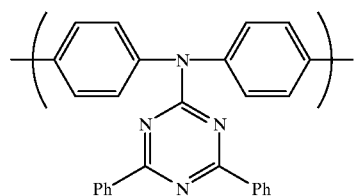

(15)

15. A polymer according to claim 1, which comprises a homopolymer or homo-oligomer.

16. A polymer according to claim 1, which comprises a copolymer or co-oligomer.

17. A polymer according to claim 1, which comprises a dendrimer.

18. A polymer according to claim 17, wherein the or one of the structural units comprises a core unit.

19. A polymer according to claim 17, which comprises a single structural unit.

20. A polymer according to claim 17, wherein the structural unit comprises Ar$^h$(NAr²)₃, where each (NAr₂) is the same or different.

21. A polymer according to claim 20, wherein each (NAr₂) is the same.

22. A polymer according to claim 17, wherein Ar$^h$ comprises a group as shown in formula (5):

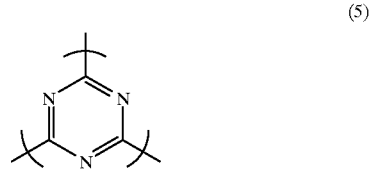

(5)

23. A polymer according to claim 22, wherein the structural unit comprises a group having formula (6):

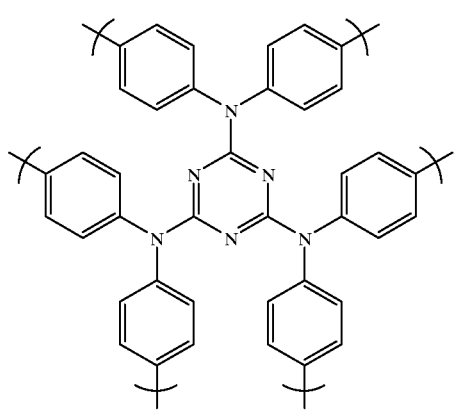

(6)

24. A polymer according to claim 17, wherein the structural unit comprises Ar$^h$(NAr₂)₂Ar, where Ar is a substituted or unsubstituted aryl or heteroaryl group and each (NAr₂) is the same or different.

25. A polymer according to claim 24, wherein each (NAr₂) is the same.

26. A polymer according to claim 24, wherein Ar" is a substituted or unsubstituted phenyl group.

27. A polymer according to claim 26, wherein the structural unit comprises a group as shown in formula (7):

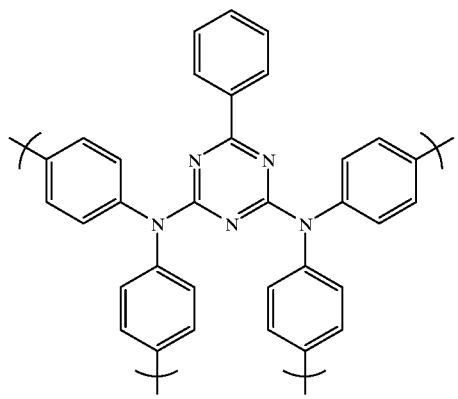

(7)

28. An optical device comprising a substrate and a composition supported by the substrate, which composition comprises a polymer according to claim 1.

29. An optical device according to claim 28 which comprises an electroluminescent device.

30. An optical device according to claim 29 in which the composition includes an electroluminescent emissive layer.

31. An optical device according to claim 29 in which the composition includes an electron-transporting layer.

32. An optical device according to claim 29 in which the composition includes a hole-transporting layer.

33. An optical device having a component comprising a polymer according to claim 1.

34. An optical device according to claim 33, comprising an electroluminescent device.

35. An optical device according to claim 33 wherein said component is an emissive layer.

36. An optical device according to claim 33 wherein said component is an electron-transporting layer.

37. An optical device according to claim 33 wherein said component is a hole-transporting layer.

38. A polymer according to claim 1, wherein $Ar^h$ comprises 1,3,5-triazine.

* * * * *